(12) United States Patent
Ryu

(10) Patent No.: US 9,726,970 B2
(45) Date of Patent: Aug. 8, 2017

(54) METHOD OF FABRICATING REFLECTIVE PHOTOMASK

(71) Applicant: SK hynix Inc., Gyeonggi-do (KR)

(72) Inventor: Choong Han Ryu, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 31 days.

(21) Appl. No.: 15/065,105

(22) Filed: Mar. 9, 2016

(65) Prior Publication Data

US 2017/0123304 A1    May 4, 2017

(30) Foreign Application Priority Data

Oct. 28, 2015   (KR) .................... 10-2015-0150137

(51) Int. Cl.
*G03F 1/24* (2012.01)
*G03F 7/20* (2006.01)
*G03F 1/78* (2012.01)

(52) U.S. Cl.
CPC .............. *G03F 1/24* (2013.01); *G03F 1/78* (2013.01); *G03F 7/2063* (2013.01); *G03F 7/2065* (2013.01)

(58) Field of Classification Search
CPC . G03F 1/24; G03F 1/78; G03F 7/2063; G03F 7/2065

USPC ................. 430/5; 216/12, 66, 87, 94
See application file for complete search history.

(56) References Cited

U.S. PATENT DOCUMENTS

| | | | | |
|---|---|---|---|---|
| 6,514,877 | B1* | 2/2003 | Beauvais | B82Y 10/00 427/495 |
| 8,679,707 | B2 | 3/2014 | Lee et al. | |
| 8,691,476 | B2 | 4/2014 | Yu et al. | |
| 2002/0122989 | A1* | 9/2002 | Stearns | B82Y 10/00 430/5 |
| 2003/0039922 | A1* | 2/2003 | Han | B82Y 10/00 430/312 |
| 2014/0011121 | A1* | 1/2014 | Yu | G03F 1/24 430/5 |
| 2016/0048073 | A1* | 2/2016 | Lee | G03F 1/74 430/5 |

* cited by examiner

*Primary Examiner* — John A McPherson
(74) *Attorney, Agent, or Firm* — IP & T Group LLP

(57) ABSTRACT

A method of fabricating a reflective photomask is provided. The method includes sequentially forming a multi-layered reflective layer, an absorption layer and an anti-reflective coating (ARC) layer on a substrate. ARC patterns are formed to expose a portion of the absorption layer by directly irradiating an ion beam onto a portion of the ARC layer to etch the portion of the ARC layer. The exposed portion of the absorption layer is etched using the ARC patterns as etch masks to form absorption patterns exposing a portion of the multi-layered reflective layer.

19 Claims, 5 Drawing Sheets

METHOD OF FABRICATING REFLECTIVE PHOTOMASK

CROSS-REFERENCES TO RELATED APPLICATIONS

The present application claims priority under 35 U.S.C 119(a) to Korean Patent Application No. 10-2015-0150137, filed on Oct. 28, 2015, which is incorporated herein by reference in its entirety.

BACKGROUND

1. Technical Field

Various embodiments of the present disclosure relate generally to photomasks and, more particularly, to a method of fabricating a reflective photomask.

2. Related Art

Integration density of semiconductor devices has been continuously increased with the development of nano-technology. As the semiconductor devices become more highly integrated, some elements such as transistors and interconnection lines have been scaled down to reduce their sizes. Next-generation semiconductor technologies may depend on process technologies, which provide the possibility of formation of fine patterns, rather than circuit design technologies. Formation of the fine patterns typically involves use of photolithography process technologies. Generally, a photolithography process may include forming a photoresist layer on a semiconductor substrate, transferring desired pattern images onto the photoresist layer using a light to selectively expose portions of the photoresist layer, and developing the exposed photoresist layer with a developer to form photoresist patterns. The light used in the exposure step may directly affect the resolution of the photoresist patterns.

For example, the resolution of the photoresist patterns may depend on the wavelength of the light used in the exposure step of the photolithography process. Various lights may be used in the exposure step of the photolithography process. For example, the light used in the exposure step of the photolithography process may be one of an i-line beam having a wavelength of about 365 nanometers, a krypton fluoride (KrF) laser beam having a wavelength of about 248 nanometers, or an argon fluoride (ArF) laser beam having a wavelength of about 193 nanometers. Even though lights having short wavelengths, such as the i-line beam, the KrF laser beam and the ArF laser beam are used in the exposure step of the photolithography process, there may be still limitations in enhancing the pattern resolutions of the highly integrated semiconductor devices. Thus, in recent years, extreme ultraviolet (EUV) rays referred to as soft X-rays have been revealed to overcome the limitations of the photolithography processes utilizing the i-line beam, the KrF laser beam or the ArF laser beam as a light source.

An EUV ray has a wavelength of about 13.5 nanometers which is considerably less than those of the i-line beam, the KrF laser beam or the ArF laser beam. Since the wavelength of the light used in the exposure step may directly affect the pattern resolution, an EUV lithography process utilizing an EUV ray as a light source may exhibit a remarkably higher pattern resolution than a photolithography process utilizing an i-line beam, a KrF laser beam, or an ArF laser beam as a light source. However, an EUV ray has also higher energy because the wavelength of the EUV ray is shorter than an i-line beam, a KrF laser beam, or an ArF laser beam. Thus, it may be difficult to use conventional transmission-type photomasks in an EUV lithography process. This is because transparent substrates of conventional transmission-type photomasks are too weak to endure the high energy of the EUV ray and the energy efficiency of the EUV ray is too low to enhance the pattern resolution. Accordingly, reflective photomasks have been proposed to overcome the disadvantages of the typical transmission-type photomasks. When the reflective photomasks are used in an EUV lithography process, the EUV ray may be reflected on surfaces of the reflective photomasks without penetrating the reflective photomasks. Hence, the high energy of the EUV ray may not be applied to the substrates of the reflective photomasks.

SUMMARY

Various embodiments are directed to a method of fabricating a reflective photomask. Reflective photomasks are used in fabrication of semiconductor devices.

According to some embodiments, there is provided a method of fabricating a reflective photomask. The method includes sequentially forming a multi-layered reflective layer, an absorption layer and an anti-reflective coating (ARC) layer on a substrate. ARC patterns are formed to expose a portion of the absorption layer by directly irradiating an ion beam onto a portion of the ARC layer to etch the portion of the ARC layer. The exposed portion of the absorption layer is etched using the ARC patterns as etch masks to form absorption patterns exposing a portion of the multi-layered reflective layer.

According to another embodiment, there is provided a method of fabricating a reflective photomask. The method includes providing a reflective photomask blank including a multi-layered reflective layer, an absorption layer and an anti-reflective coating (ARC) layer which are stacked sequentially on a substrate. ARC patterns are formed to expose a portion of the absorption layer by directly irradiating an ion beam onto a portion of the ARC layer to etch the portion of the ARC layer. The exposed portion of the absorption layer is etched using the ARC patterns as etch masks to form absorption patterns exposing a portion of the multi-layered reflective layer.

BRIEF DESCRIPTION OF THE DRAWINGS

Various embodiments of the present disclosure will become more apparent in view of the attached drawings and accompanying detailed description, in which.

DESCRIPTION OF SPECIFIC EMBODIMENTS

Generally, a reflective photomask blank may include a multi-layered reflective layer, an absorption layer, an anti-reflective coating (ARC) layer and a resist layer which are sequentially stacked on a substrate. In order to fabricate a reflective photomask using the reflective photomask blank, the resist layer may be patterned to form resist patterns using an exposure step and a development step of a photolithography process or an electron beam (e-beam) lithography process. Subsequently, underlying layers such as the ARC layer and the absorption layer may be etched using the resist patterns as etch masks.

However, in such a case, it is well known in the art that the photolithography process may suffer from pattern distortion whereas the e-beam lithography process may suffer from a fogging effect due to reflection of electrons. In addition, when the underlying layers are etched using the resist patterns as etch masks, there may be limitations in increasing the magnitude of the bias power of the etch apparatus because of the material properties of the resist patterns. Low bias power of the etch apparatus may cause non-uniformity of the etch rate.

According to embodiments of the present disclosure, the ARC layer may be directly etched with an ion beam without use of the photolithography process or the e-beam lithography process. Thus, the present disclosure may provide methods of fabricating reflective photomasks, which are capable of overcoming disadvantages associated with the photolithography and or the e-beam lithography processes.

It will be understood that although the terms first, second, third and so on may be used herein to describe various elements, these elements should not be limited by these terms. These terms are only used to distinguish one element from another element. Thus, a first element in an embodiment could be termed a second element in other embodiments without departing from the teachings of the present disclosure. It will also be understood that when an element is referred to as being located "on," "over," "above," "under," "beneath," "below," "side," or "aside" another element, it may directly contact the other element, or at least one intervening element may be present therebetween. Accordingly, the terms such as "on," "over," "above," "under," "beneath," "below," "side," "aside," and the like that are used herein are for the purpose of describing only a position relationship of two elements and are not intended to limit the scope of the present disclosure. It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
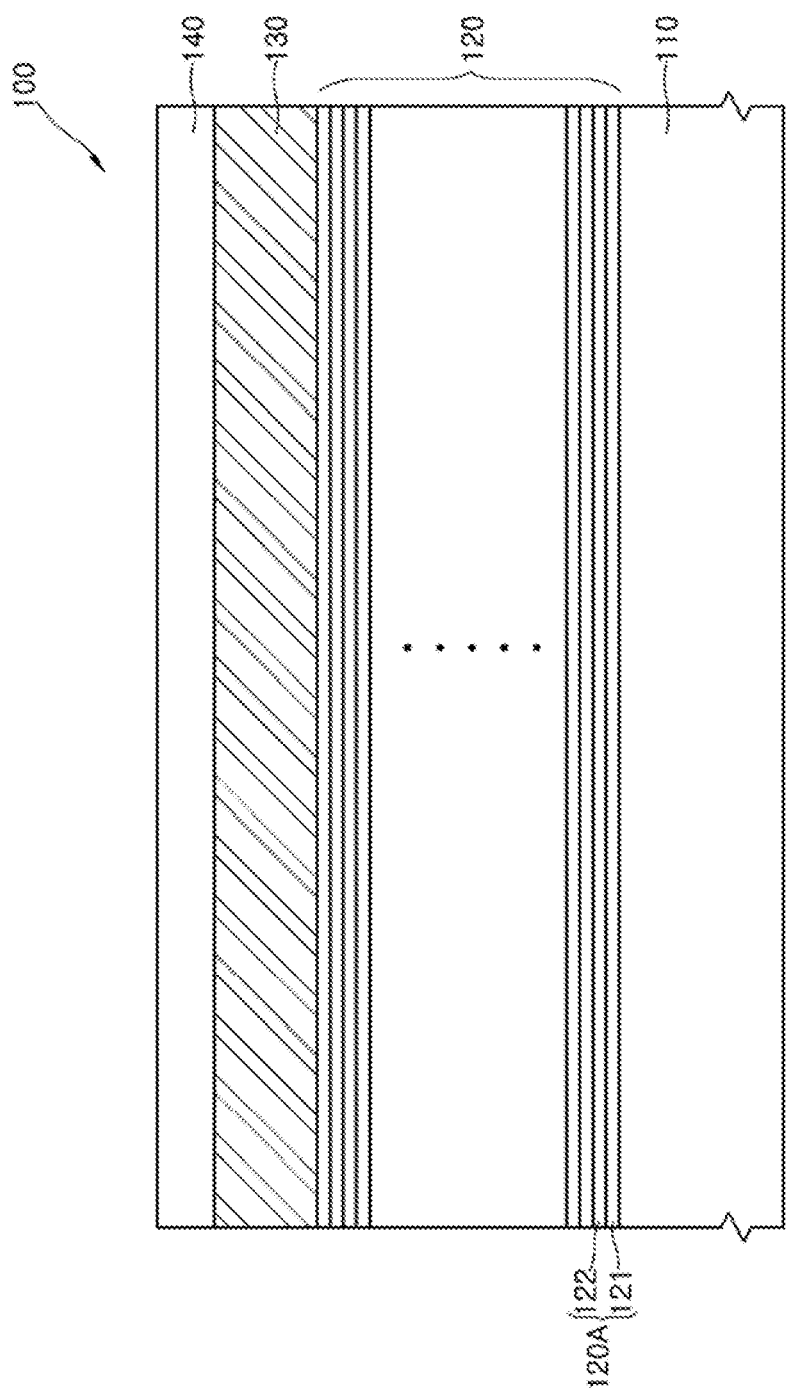
FIG. 1 is a cross-sectional view of a reflective photomask blank used in fabrication of a reflective photomask, according to an embodiment of the present disclosure.

FIG. 1 is a cross-sectional view of a reflective photomask blank 100 used in fabrication of a reflective photomask, according to an embodiment.

Referring to FIG. 1, the reflective photomask blank 100 may be formed by sequentially stacking a multi-layered reflective layer 120, an absorption layer 130 and an anti-reflective coating (ARC) layer 140 on a substrate 110 in the described order.

The substrate 110 may be a low thermal expansion material (LTEM). When an EUV ray is absorbed into the substrate the high energy of the EUV ray may be transformed into a thermal energy increasing the temperature of the substrate and expanding the volume of the substrate. Thus, the substrate 110 may be or comprise a material having a low thermal expansion coefficient for suppressing the temperature increase of the substrate 110 when the EUV ray is absorbed into the substrate 110. In an embodiment, the substrate 110 may include a material having a thermal expansion coefficient with a pattern disposition error rate of about ±0.05 ppm/° C. within a temperature range of 0° C. to 50° C. Further, the substrate 110 may have an excellent flatness. For example, the substrate 110 may have a front surface flatness of about 50 nanometers or less and a backside surface flatness of about 500 nanometers or less. An EUV ray reflectivity of the substrate 110 may be substantially zero to prevent the EUV ray from being reflected on the substrate 110 in a border region between a pattern transfer region and a frame region.

The multi-layered reflection layer 120 may be formed to have a stack structure including a plurality of reflective layer pairs 120A which are stacked on the substrate 110. Each of the plurality of reflective layer pairs 120A may be formed to include first and second reflection layers 121 and 122 having different diffraction coefficients. The thicknesses of the first and second reflection layers may be optimized to minimize the absorption of the EUV ray and to maximize the dispersion of the EUV ray. In an embodiment, one of the first and second reflection layers 121 and 122 may be a molybdenum (Mo) layer and the other layer may be a silicon (Si) layer. The thicknesses of the molybdenum (Mo) and the silicon (Si) layers may be optimized to minimize the absorption of the EUV ray and to maximize the dispersion of the EUV ray. For example, the molybdenum (Mo) layer may have a thickness of about 4 nanometers and the silicon (Si) layer may have a thickness of about 3 nanometers. The multi-layered reflection layer 120 may have a total thickness of from about 280 nanometers to about 350 nanometers, and the number of the plurality of reflective layer pairs 120A may be within the range of from about 40 to about 50. When the number of the reflective layer pairs 120A of molybdenum and silicon constituting the multi-layered reflective layer 120 is less than about 40, the EUV ray reflectivity of the multi-layered reflective layer 120 may become insufficient. When the number of the reflective layer pairs 120A of molybdenum and silicon constituting the multi-layered reflective layer 120 is greater than about 60, the EUV ray reflectivity of the multi-layered reflective layer 120 and a deposition time of the multi-layered reflective layer 120 may increase above an optimum range causing a marked increase in a defect density of the multi-layered reflective layer 120.

The absorption layer 130 may be formed of a metal layer suitable of absorbing an EUV ray when an exposure step is performed using a reflective photomask fabricated according to an embodiment of the invention. The absorption layer 130 may be formed to include a material having a relatively high EUV ray absorptiveness. For example, the absorption layer 130 may be formed to include an aluminum copper (AlCu) layer, a titanium (Ti) layer, a titanium nitride (TiN) layer, a tantalum (Ta) layer, a tantalum nitride (TaN) layer, a tantalum boron nitride (TaBN) layer or a chrome (Cr) layer. The absorption layer 130 may be formed of a suitable material having a suitable thickness so that the multi-layered reflective layer 120 covered with the absorption layer 130 may exhibit an EUV ray reflectivity of about 1% or less.

Although not shown in the drawings, a buffer layer may be additionally formed between the absorption layer 130 and the multi-layered reflective layer 120. The buffer layer may be formed to protect the multi-layered reflective layer 120 while the absorption layer 130 is patterned.

A capping layer may be additionally formed between the absorption layer 130 and the multi-layered reflective layer 120. The capping layer may be formed to protect the multi-layered reflective layer 120. The capping layer may be thinly formed of a material having a relatively low EUV ray absorptiveness to suppress degradation of an EUV ray reflectivity of the multi-layered reflective layer 120. In an embodiment, the capping layer may be formed to include a silicon (Si) layer or a ruthenium (Ru) layer having a thickness of about 1 nanometer to about 2.5 nanometers.

The ARC layer 140 may be formed to suppress a light reflection on the absorption layer 130 when a pattern defect inspection process is performed using a deep ultra-violet (DUV) ray. The ARC layer 140 may be formed to include a tantalum boron oxynitride (TaBON) layer or a tantalum oxynitride (TaON) layer. In an embodiment, the ARC layer 140 may be formed to have a thickness of from about 5 nanometers to about 13 nanometers. As described more fully hereinafter, the absorption layer 130 may be pattered without use of a photolithography or an e-beam lithography process. Thus, the reflective photomask blank 100 does not need to include a resist layer.

Figure 2:
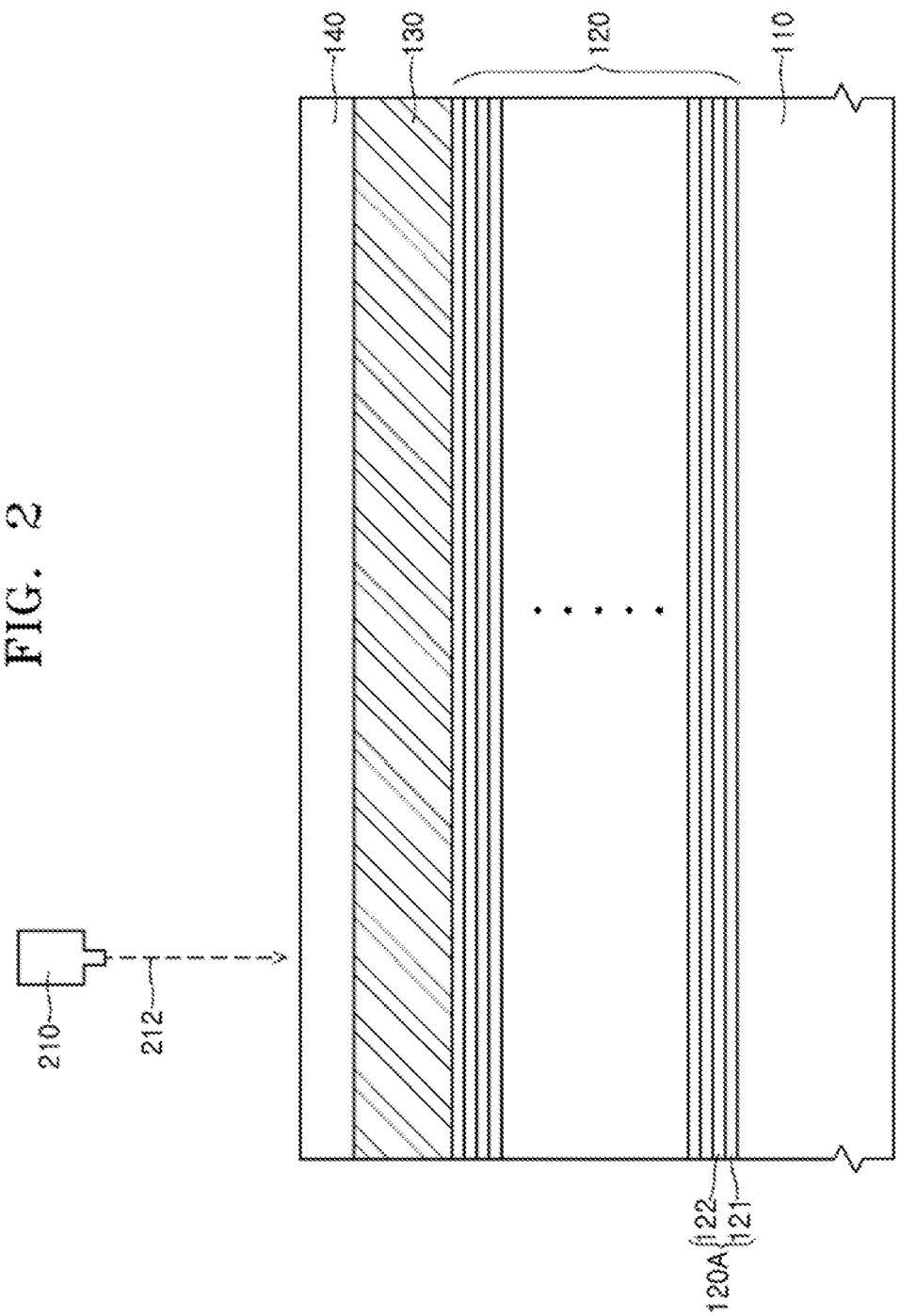
FIG. 2 is a cross-sectional view of the reflective photomask blank shown in FIG. 1 further illustrating an ion beam source for patterning an anti-reflective coating (ARC) layer on the reflective photomask blank, according to an embodiment of the present disclosure.
Figure 3:
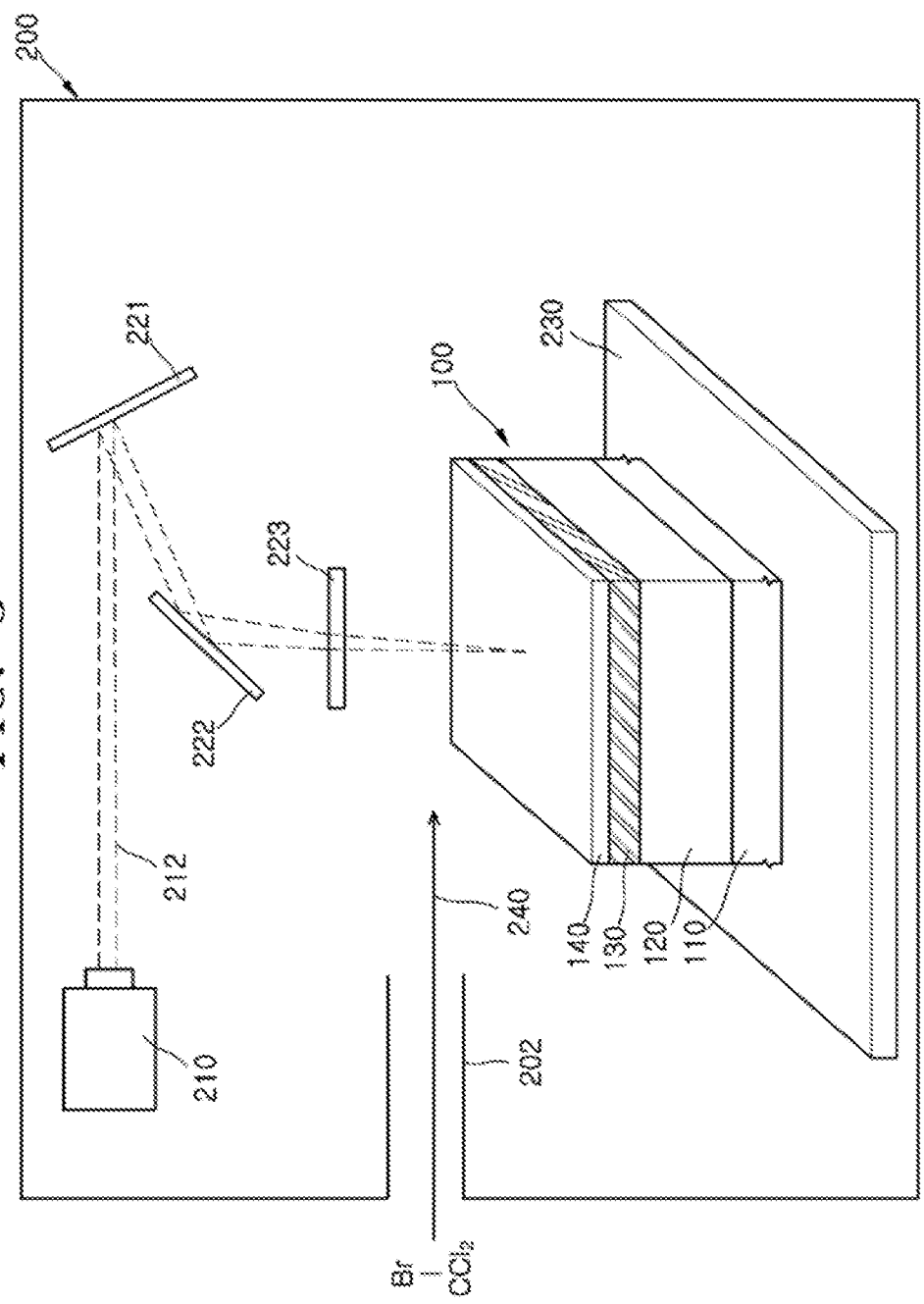
FIG. 3 is a diagram illustrating an ion beam apparatus and a reflective photomask inside a vacuum chamber for patterning an anti-reflective coating (ARC) layer on the reflective photomask blank, according to an embodiment of the present disclosure.
Figure 4:
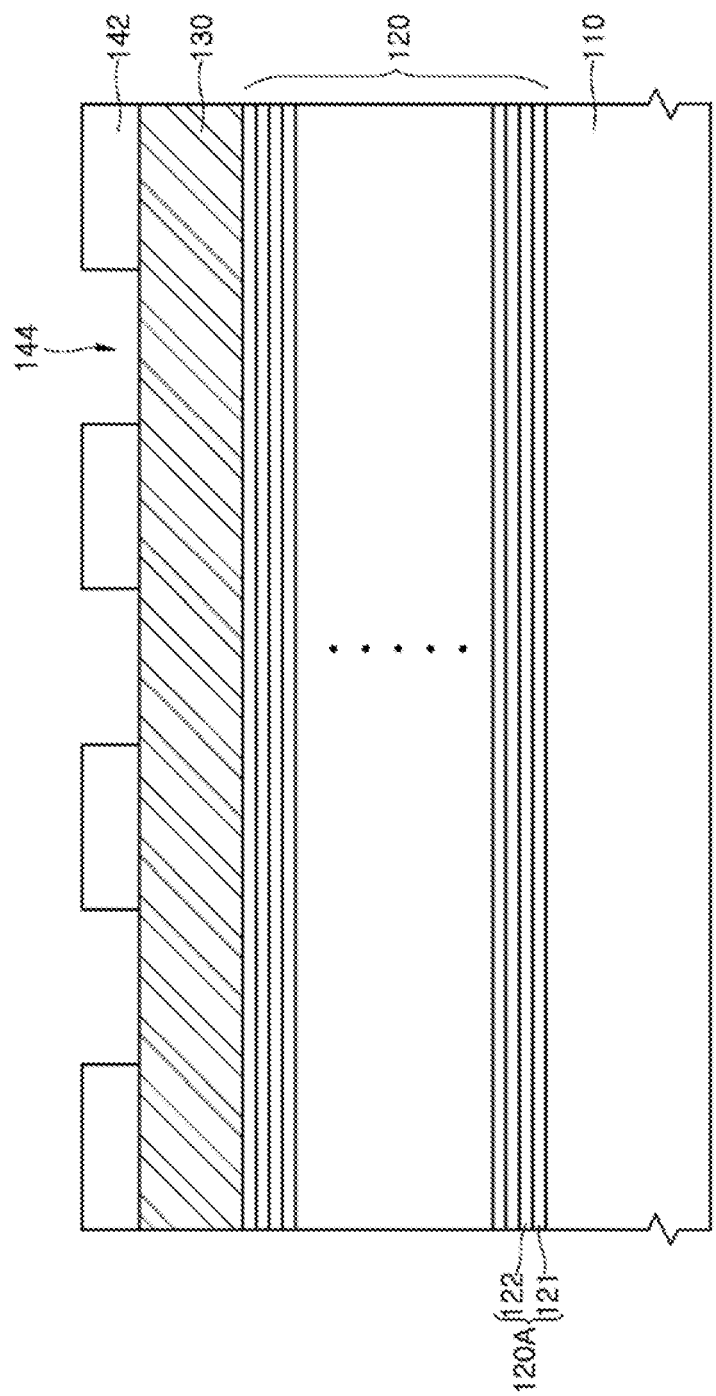
FIG. 4 is a cross-sectional view of a reflective photomask blank illustrating anti-reflective coating (ARC) patterns formed on the reflective photomask blank, according to an embodiment of the present disclosure.

FIG. 2 is a cross-sectional view of the reflective photomask blank 100 shown in FIG. 1 further illustrating an ion beam source for patterning the ARC layer 140 of the reflective photomask blank 100. FIG. 3 is a simplified diagram providing further details of an ion beam apparatus for forming ARC patterns in a fabrication method of a reflective photomask, according to an embodiment of the present invention. FIG. 4 is a cross-sectional view of a reflective photomask blank illustrating anti-reflective coating (ARC) patterns formed on the reflective photomask blank, according to an embodiment of the invention.

Referring to FIGS. 2 to 4, the ARC layer 140 may be etched by directly irradiating an ion beam 212 onto portions of the ARC layer 140, thereby forming the ARC patterns 142 (shown in FIG. 4) that expose portions of the absorption layer 130. More specifically, the reflective photomask blank 100 shown in FIG. 1 may be loaded into a vacuum chamber 200. Subsequently, after the ion beam 212 is generated from an ion beam source 210, the ion beam 212 may be irradiated onto a top surface of the ARC layer 140. The ion beam source 210 may be a gallium (Ga) source. The vacuum chamber may include a unit 221, 222, 223 for providing a travelling path of the ion beam 212 and a unit for accelerating the ion beam 212. The ion beam 212 may be irradiated onto the ARC layer 140 at a right angle to a top surface of the ARC layer 140. While the ion beam 212 is irradiated onto the ARC layer 140, an appropriate reaction gas denoted by arrow 240 may be supplied onto the ARC layer 140 via an opening 202. In an embodiment, when the ARC layer 140 is formed of a tantalum boron oxynitride (TaBON) layer or a tantalum oxynitride (TaON) layer, a mixture gas of a bromine (Br) gas, an iodine ($I_2$) gas and or a carbon dichloride ($CCl_2$) gas may be used as the reaction gas. In an embodiment, the reaction gas may be a mixture of a bromine (Br) gas and carbon dichloride ($CCL_2$). In another embodiment the reaction gas may be a mixture gas of a xenon (Xe) gas, a water vapor ($H_2O$) and or a nitrogen dioxide ($NO_2$) gas.

When the ion beam 212 is irradiated onto the ARC layer 140 while the reaction gas is supplied onto the ARC layer 140, the ARC layer 140 may be physically and chemically etched by the ion bombardment energy of the ion beam 212 and the reaction gas, respectively. Patterning the ARC layer 140 may be achieved by selectively irradiating the ion beam 212 onto predetermined regions of the ARC layer 140. That is, the predetermined regions of the ARC layer 140 onto which the ion beam 212 is directly irradiated may be selectively removed to provide an opening 144 as shown in FIG. 4. The opening 144 may expose portions of the absorption layer 130.

Figure 5:
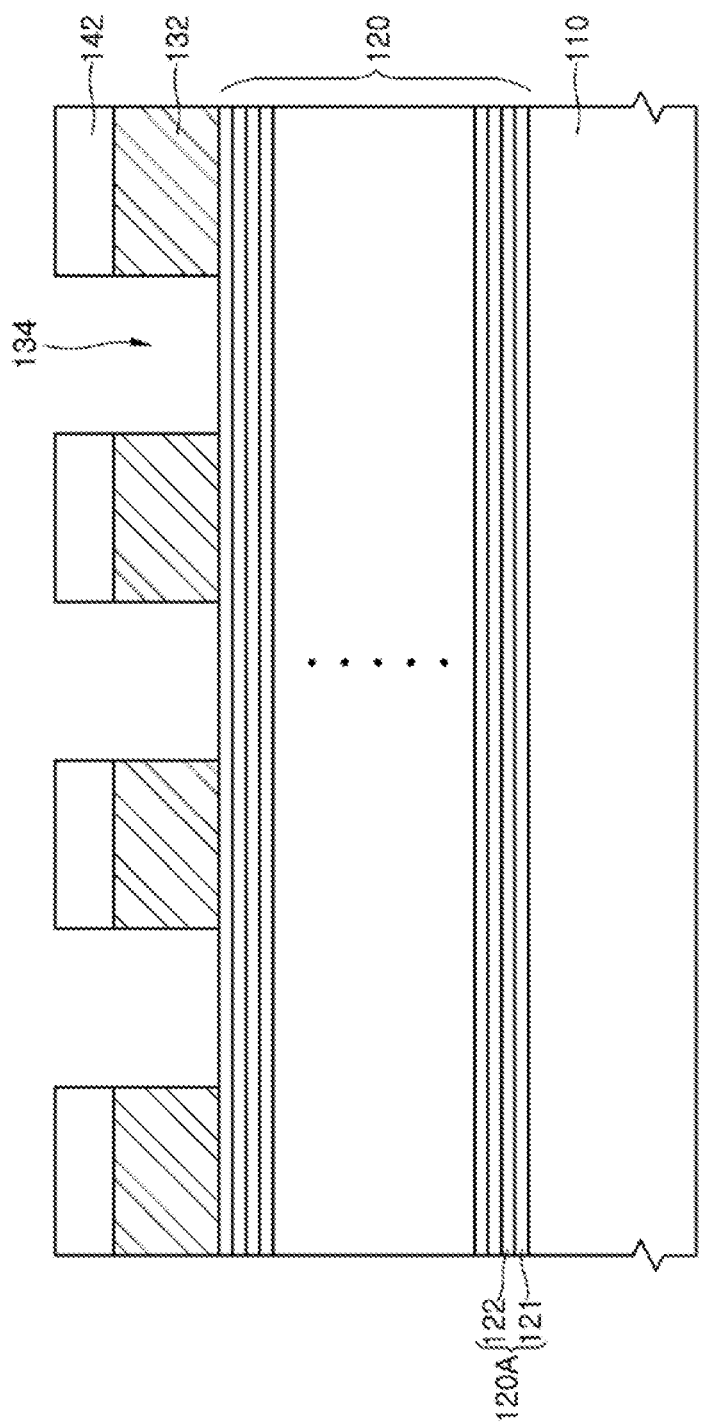
FIG. 5 is a cross-sectional view of a reflective photomask having a plurality of absorption patterns formed, according to an embodiment of the present disclosure.

FIG. 5 is a cross-sectional view of a reflective photomask, having a plurality of absorption patterns 132 formed, according to an embodiment of the invention.

Referring to FIG. 5, the exposed portions of the absorption layer 130 may be etched using the ARC patterns 142 as etch masks. In an embodiment, the exposed portions of the absorption layer 130 may be etched using a plasma etch process that employs a fluorine (F) gas as an etch gas. The exposed portions of the absorption layer 130 may be etched and removed to form absorption patterns 132. The exposed portions of the absorption layer 130 may be removed to provide an opening 134 that exposes portions of the multi-layered reflective layer 120. After the absorption patterns 132 are formed, the ARC patterns 142 may be removed.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A method of fabricating a reflective photomask, the method comprising:
   sequentially forming a multi-layered reflective layer, an absorption layer and an anti-reflective coating (ARC) layer on a substrate;
   forming ARC patterns exposing a portion of the absorption layer by directly irradiating an ion beam onto a portion of the ARC layer to etch the portion of the ARC layer; and
   etching the exposed portion of the absorption layer using the ARC patterns as etch masks to form absorption patterns exposing a portion of the multi-layered reflective layer.

2. The method of claim 1, wherein the ARC layer includes a tantalum boron oxynitride (TaBON) layer or a tantalum oxynitride (TaON) layer.

3. The method of claim 1, wherein the ARC layer has a thickness of from about 5 nanometers to about 13 nanometers.

4. The method of claim 1, wherein the forming of the ARC patterns includes chemical etch of the ARC layer.

5. The method of claim 4, wherein the chemical etch includes supplying of a reaction gas during the direct irradiating of the ion beam.

6. The method of claim 5, wherein the reaction gas includes a mixture gas of a bromine (Br) gas, an iodine ($I_2$) gas and/or a carbon dichloride ($CCl_2$) gas.

7. The method of claim 5, wherein the reaction gas includes a mixture gas of a xenon (Xe) gas, a water vapor ($H_2O$) and/or a nitrogen dioxide ($NO_2$) gas.

8. The method of claim 1, wherein the substrate is a low thermal expansion layer, the multilayered reflective layer includes a plurality of silicon and molybdenum pairs of reflective layers, the absorption layer is a metal layer, and the ARC layer includes a tantalum boron oxynitride layer or a tantalum oxynitride layer.

9. The method of claim 8, wherein the multilayered reflective layer has a thickness of from about 280 to about 350 nm, the pairs of molybdenum and silicon reflective layers are from about 50 to about 60, and the ARC layer has a thickness of from about 5 nanometers to about 13 nanometers.

10. The method of claim 9, wherein the substrate has a front surface flatness of about 50 nanometers or less and a backside surface flatness of about 500 nanometers or less.

11. The method of claim 10, wherein the substrate has a substantially zero EUV ray reflectivity.

12. A method of fabricating a reflective photomask, the method comprising:
 providing a reflective photomask blank including a multi-layered reflective layer, an absorption layer and an anti-reflective coating (ARC) layer which are stacked sequentially on a substrate;
 forming ARC patterns exposing a portion of the absorption layer by directly irradiating an ion beam onto a portion of the ARC layer to etch the portion of the ARC layer; and
 etching the exposed portion of the absorption layer using the ARC patterns as etch masks to form absorption patterns exposing a portion of the multi-layered reflective layer.

13. The method of claim 12, wherein the reflective photomask blank is provided so that an entire top surface of the ARC layer is exposed.

14. The method of claim 12, wherein the ARC layer includes a tantalum boron oxynitride (TaBON) layer or a tantalum oxynitride (TaON) layer.

15. The method of claim 12, wherein the ARC layer has a thickness of about 5 nanometers to about 13 nanometers.

16. The method of claim 12, the forming ARC patterns is performed further by supplying a reaction gas onto the ARC layer for inducing a chemical etch of the ARC layer.

17. The method of claim 16, wherein the supplying of the reaction gas is performed during the direct irradiating of the ion beam onto the portion of the ARC layer.

18. The method of claim 16, wherein the reaction gas includes a mixture gas of a bromine (Br) gas, an iodine ($I_2$) gas and a carbon dichloride ($CCl_2$) gas.

19. The method of claim 16, wherein the reaction gas includes a mixture gas of a xenon (Xe) gas, a water vapor ($H_2O$) and a nitrogen dioxide ($NO_2$) gas.

* * * * *